United States Patent
Shioda et al.

(10) Patent No.: US 12,125,878 B2
(45) Date of Patent: Oct. 22, 2024

(54) SEMICONDUCTOR DEVICE AND MANUFACTURING METHOD THEREOF

(71) Applicant: Kioxia Corporation, Tokyo (JP)

(72) Inventors: Tomonari Shioda, Yokkaichi (JP); Yasunori Oshima, Yokkaichi (JP); Taichi Iwasaki, Yokkaichi (JP); Shota Yamagiwa, Yokkaichi (JP); Hiroto Saito, Yokkaichi (JP)

(73) Assignee: Kioxia Corporation, Tokyo (JP)

( * ) Notice: Subject to any disclaimer, the term of this patent is extended or adjusted under 35 U.S.C. 154(b) by 0 days.

(21) Appl. No.: 17/350,492

(22) Filed: Jun. 17, 2021

(65) Prior Publication Data

US 2022/0077286 A1     Mar. 10, 2022

(30) Foreign Application Priority Data

Sep. 10, 2020   (JP) ................................. 2020-152066

(51) Int. Cl.
| | |
|---|---|
| *H01L 29/08* | (2006.01) |
| *H01L 27/12* | (2006.01) |
| *H01L 29/40* | (2006.01) |
| *H01L 29/417* | (2006.01) |
| *H01L 29/66* | (2006.01) |
| *H01L 29/78* | (2006.01) |
| *H01L 29/167* | (2006.01) |
| *H01L 29/45* | (2006.01) |

(52) U.S. Cl.
CPC ...... *H01L 29/0847* (2013.01); *H01L 27/1207* (2013.01); *H01L 29/401* (2013.01); *H01L 29/41766* (2013.01); *H01L 29/66636* (2013.01); *H01L 29/7848* (2013.01); *H01L 29/167* (2013.01); *H01L 29/456* (2013.01)

(58) Field of Classification Search
None
See application file for complete search history.

(56) References Cited

U.S. PATENT DOCUMENTS

| | | | |
|---|---|---|---|
| 10,084,063 B2 * | 9/2018 | Kuang | ................ H01L 29/7848 |
| 10,665,608 B2 | 5/2020 | Shioda et al. | |
| 2002/0125479 A1 * | 9/2002 | Lippert | ............. H01L 21/26506 438/150 |

(Continued)

FOREIGN PATENT DOCUMENTS

| | | |
|---|---|---|
| JP | 2011-151318 A | 8/2011 |
| JP | 2019-201040 A | 11/2019 |

*Primary Examiner* — Ali Naraghi
(74) *Attorney, Agent, or Firm* — Oblon, McClelland, Maier & Neustadt, L.L.P.

(57) ABSTRACT

A semiconductor device in an embodiment includes a substrate and a transistor. The transistor includes a source layer, a drain layer, a gate insulation film, a gate electrode, a contact plug and a first epitaxial layer. The source layer and the drain layer are provided in surface regions of the substrate, and contain an impurity. The gate insulation film is provided on the substrate between the source layer and the drain layer. The gate electrode is provided on the gate insulation film. The contact plug is provided so as to protrude to the source layer or the drain layer downward of a surface of the substrate. The first epitaxial layer is provided between the contact plug and the source layer or drain layer, and contains both the impurity and carbon.

8 Claims, 11 Drawing Sheets

(56) References Cited

U.S. PATENT DOCUMENTS

| | | | |
|---|---|---|---|
| 2008/0132039 A1* | 6/2008 | Cho | H01L 29/66628 257/E21.129 |
| 2009/0309140 A1* | 12/2009 | Khamankar | H01L 29/0847 257/E21.441 |
| 2010/0038727 A1* | 2/2010 | Chakravarthi | H01L 29/66628 257/408 |
| 2010/0230721 A1 | 9/2010 | Yasutake | |
| 2012/0032275 A1* | 2/2012 | Haran | H01L 29/7843 257/E21.409 |
| 2012/0181625 A1* | 7/2012 | Kwok | H01L 29/66628 257/E21.409 |
| 2017/0294508 A1* | 10/2017 | Hsu | H01L 29/0847 |
| 2018/0294225 A1 | 10/2018 | Lee et al. | |
| 2019/0348434 A1 | 11/2019 | Shioda et al. | |
| 2019/0378927 A1 | 12/2019 | Lin et al. | |
| 2020/0075399 A1 | 3/2020 | Kim et al. | |
| 2020/0381537 A1* | 12/2020 | Lin | H01L 21/3065 |

\* cited by examiner

SEMICONDUCTOR DEVICE AND MANUFACTURING METHOD THEREOF

CROSS REFERENCE TO RELATED APPLICATIONS

This application is based upon and claims the benefit of priority from the prior Japanese Patent Application No. 2020-152066, filed on Sep. 10, 2020, the entire contents of which are incorporated herein by reference.

FIELD

The embodiments of the present invention relate to a semiconductor device and a manufacturing method thereof.

BACKGROUND

There have been developed NAND flash memories including a vertical memory cell array configured such that memory cells are disposed in a three-dimensional manner. In some of such memory devices, the memory cell array may be provided above a CMOS (Complementary Metal Oxide Semiconductor) circuit that controls the memory cell array. In this case, in a heat treatment process for forming the memory cell array, heat load is applied on the CMOS circuit and a contact plug, resulting in adverse influences on the electric characteristics of the CMOS and contact resistance. For example, in a diffusion layer of a P-type MOSFET (MOS Field Effect Transistor), boron is used as an impurity. For restraining the contact resistance, it is conceivable to implant a large amount of boron into a connection portion between the contact plug and the diffusion layer. However, in this case, boron is likely to diffuse into a channel portion, which is likely to cause a short channel effect.

DETAILED DESCRIPTION

Figure 1:
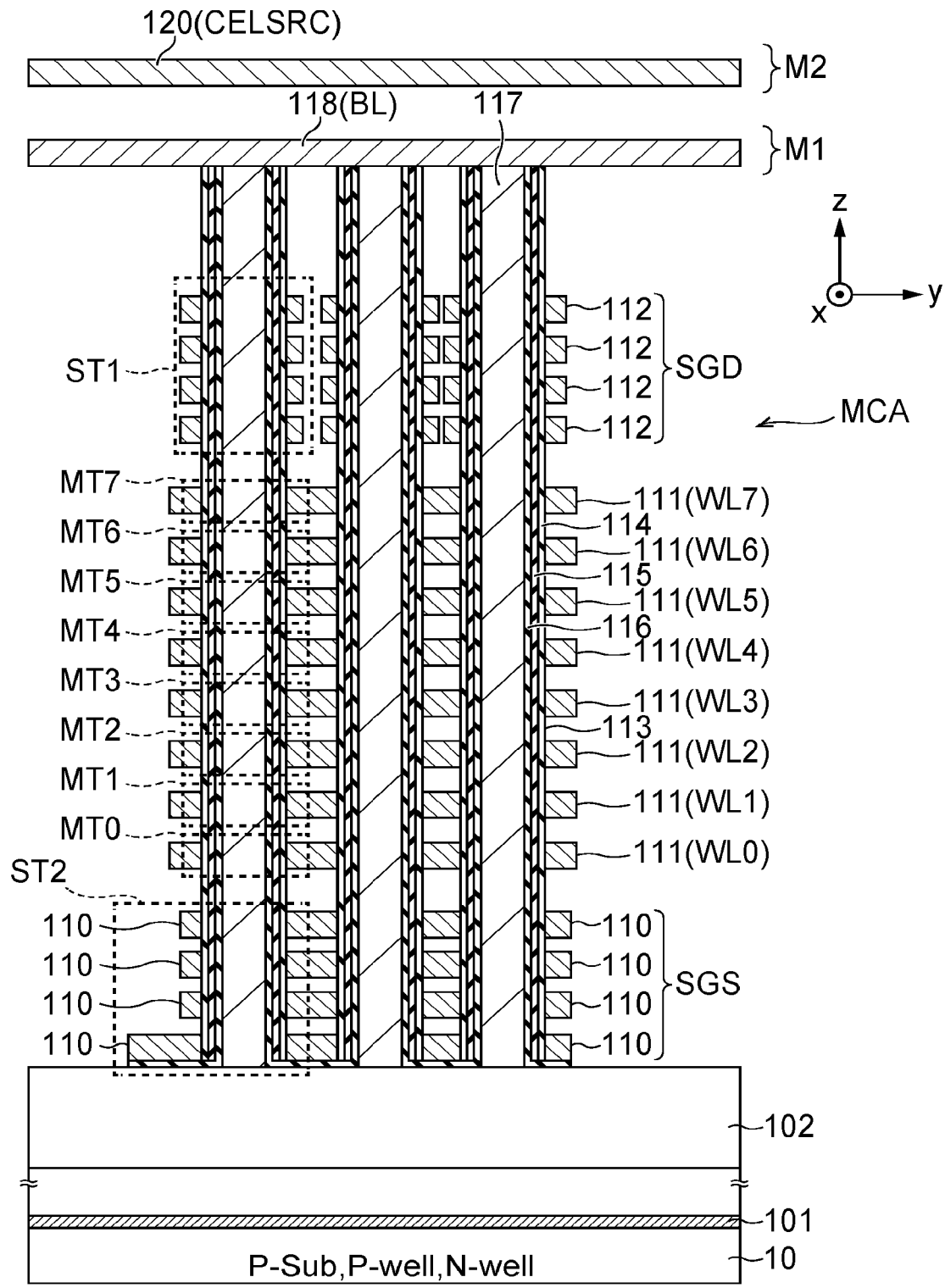
FIG. 1 is a diagram showing an example of the configuration of a memory cell array in a semiconductor device according to a first embodiment.

Embodiments will now be explained with reference to the accompanying drawings. The present invention is not limited to the embodiments. In the embodiments, "an upper direction" or "a lower direction" refers to a relative direction when a direction perpendicular to a surface of a semiconductor substrate on which semiconductor elements are provided is assumed as "an upper direction". Therefore, the term "upper direction" or "lower direction" occasionally differs from an upper direction or a lower direction based on a gravitational acceleration direction. In the present specification and the drawings, elements identical to those described in the foregoing drawings are denoted by like reference characters and detailed explanations thereof are omitted as appropriate.

Semiconductor devices in the embodiments each include a substrate and a transistor. The transistor includes a source layer, a drain layer, a gate insulation film, a gate electrode, a contact plug and a first epitaxial layer. The source layer and the drain layer are provided in surface regions of the substrate, and contain an impurity. The gate insulation film is provided on the substrate between the source layer and the drain layer. The gate electrode is provided on the gate insulation film. The contact plug is provided so as to protrude to the source layer or the drain layer downward of a surface of the substrate. The first epitaxial layer is provided between the contact plug and the source layer or drain layer, and contains both the impurity and carbon.

First Embodiment

FIG. 1 is a diagram showing an example of the configuration of a memory cell array in a semiconductor device according to a first embodiment. In FIG. 1, for facilitating visualization, the illustration of insulation portions other than insulation films formed in memory holes 113 is omitted. Further, in the embodiments described below, although silicon is exemplified as a semiconductor, any other semiconductor than silicon may be used.

In the present invention, for explanatory convenience, an XYZ orthogonal coordinate system is introduced. In this coordinate system, the X-direction and the Y-direction are defined as two directions that are parallel to a principal surface of a semiconductor substrate 10 and that are orthogonal to each other, and the Z-direction is defined as a direction that is orthogonal to both the X-direction and the Y-direction. A plurality of word lines WL are laminated in the Z-direction.

A control circuit 101 that controls a memory cell array MCA is provided in a surface region of the semiconductor substrate 10. For example, the control circuit 101 is made from a CMOS circuit. The CMOS circuit may be provided in a P-type well or N-type well that is provided in the surface region of the semiconductor substrate 10. The memory cell array MCA including a plurality of memory cells are provided above the control circuit 101.

A plurality of NAND strings NS are formed on a polysilicon layer 102 above the control circuit 101. Specifically, a plurality of line layers 110 that function as a select gate line SGS, a plurality of line layers 111 (word lines WL0 to WL7) that function as word lines WL, and a plurality of line layers 112 that function as a select gate line SGD are formed on the polysilicon layer 102.

For example, the line layers 110 are formed as four layers, and are electrically connected with the select gate line SGS that is common among the plurality of NAND strings. The line layers 110 function as gate electrodes of two selection transistors ST2.

For example, the line layers 111 are formed as eight layers, and are electrically connected with the word line WL that is common for each layer.

For example, the line layers 112 is formed as four layers, and are electrically connected with the select gate line SGD that corresponds for each NAND string NS. Each line layer 112 functions as a gate electrode of one selection transistor ST1.

The memory hole 113 is formed so as to pass through the line layers 110, 111, 112, and to reach the polysilicon layer 102. A block insulation layer 114, a charge accumulation film 115 and a gate insulation film 116 are formed on a side surface of the memory hole 113 in order. The memory hole 113 is filled with a conduction film 117. The conduction film 117 functions as a current pathway for the NAND string NS. A line layer 118 that functions as a bit line BL is formed at an upper end of the conduction film 117.

As described above, the selection transistor ST2, a plurality of memory cell transistors MT0 to MT7 and the selection transistor ST1 are laminated on the polysilicon layer 102 in order, and one memory hole 113 corresponds to one NAND string NS. The memory cell transistors MT0 to MT7 are provided so as to correspond to cross portions between the conduction film 117 and the word lines WL0 to WL7.

A plurality of the above configurations are arrayed in the depth direction of the sheet plane on which FIG. 1 is illustrated. Thereby, the memory cell array MCA including the memory cell transistors arrayed in a three-dimensional manner is configured.

Figure 2:
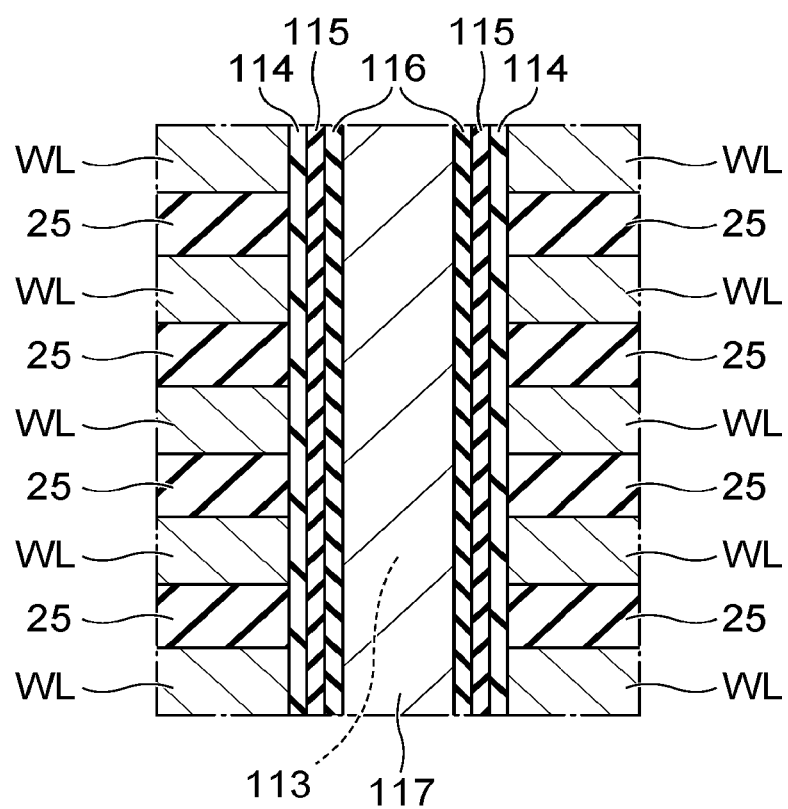
FIG. 2 is an enlarged cross sectional view of a portion where a conduction film passes through a plurality of word lines and insulation layers among layers.

FIG. 2 is an enlarged cross sectional view of a portion where the conduction film 117 passes through the plurality of word lines WL and insulation layers 25 among layers. In FIG. 2, insulation layers among the conduction layer WL that are omitted in FIG. 1 are shown as the insulation layers 25.

Between each conduction layer WL and the conduction film 117, the block insulation layer 114, the charge accumulation film 115 and the gate insulation film 116 are provided in the order from the side of the conduction layer WL. The block insulation layer 114 contacts with the conduction layer WL. The gate insulation film 116 contacts with the conduction film 117. The charge accumulation film 115 is provided between the block insulation layer 114 and the gate insulation film 116.

The conduction film 117 functions as a channel. The conduction layer WL functions as a control gate. The charge accumulation film 115 functions as a data storage layer that accumulates charges implanted from the conduction film 117. That is, a memory cell having a structure in which the control gate surrounds the channel is formed at the cross portion between the conduction film 117 and each conduction layer WL.

The semiconductor device according to the embodiment is a non-volatile semiconductor device that allows electric erasing and writing of data unrestrictedly and that can hold stored contents even when a power supply is turned off. For example, the memory cell is a memory cell having a charge trap structure. The charge accumulation film 115 includes many traps for confining charges (electrons), and is a silicon nitride film, for example. The gate insulation film 116 is a silicon oxide film, for example, and serves as a potential barrier when charges are implanted from the conduction film 117 to the charge accumulation film 115 or when the charges accumulated in the charge accumulation film 115 are diffused to the conduction film 117. The block insulation layer 114 is a silicon oxide film, for example, and prevents the charges accumulated in the charge accumulation film 115 from being diffused to the conduction layer WL. For example, the semiconductor device may be a NAND flash memory.

Figure 3:
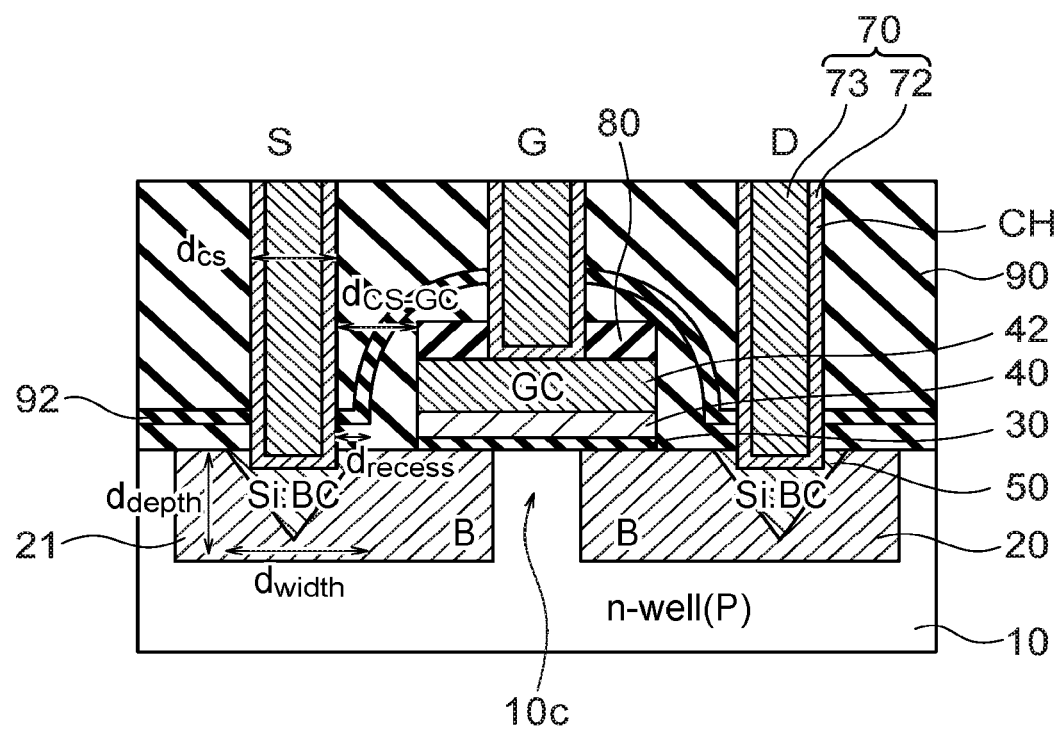
FIG. 3 is a schematic cross sectional view showing a configuration example of a P-type MOSFET of a control circuit.

FIG. 3 is a schematic cross sectional view showing a configuration example of a P-type MOSFET of the control circuit 101. The P-type MOSFET (also referred to as merely a transistor, hereinafter) includes the semiconductor substrate 10, a drain layer 20, a source layer 21, a gate insulation film 30, a gate electrode 40, a GC (Gate Conductor) 42, an epitaxial layer 50, a contact plug 70, a protection film 80, an interlayer insulation film 90 and a liner film 92. The transistor is provided as a part of the CMOS constituting the control circuit that controls the memory cell array MCA. As described with FIG. 1, the memory cell array MCA is provided above the transistor in the control circuit 101.

The semiconductor substrate 10 is a P-type silicon substrate, for example, and a P-type well or an N-type well is provided in a surface region of the semiconductor substrate 10. A P-type MOSFET is provided in the N-type well, and an N-type MOSFET is provided in the P-type well. In the embodiment, the transistor is a P-type MOSFET, and therefore, is provided in the surface region of the N-type well in the semiconductor substrate 10.

The drain layer 20 and the source layer 21 are diffusion layers that are provided in the N-type well of the semiconductor substrate 10 and that contain an impurity. The impurity is boron (B), for example. In the case where the transistor is an N-type MOSFET, the drain layer 20 and the source layer 21 are provided in the P-type well of the semiconductor substrate 10, and the impurity is phosphorus (P) or arsenic (As), for example.

The gate insulation film 30 is provided on the semiconductor substrate 10 between the drain layer 20 and the source layer 21. For example, a silicon oxide film or a high-dielectric material having a higher relative dielectric constant than the silicon oxide film is used for the gate insulation film 30.

The gate electrode 40 is provided on the gate insulation film 30. For example, a conductive material such as a doped polysilicon and a metal is used for the gate electrode 40.

The GC 42 is provided on the gate electrode 40. For example, a conductive material such as tungsten is used for the GC 42.

The epitaxial layer 50 is a doped epitaxial silicon layer that is provided between the contact plug 70 and the source layer 21 or drain layer 20 and that is doped with both boron and carbon (C) as impurities. For example, the boron concentration of the epitaxial layer 50 is $1\times10^{21}$ cm$^{-3}$ or more, and the carbon concentration is $2\times10^{20}$ cm$^{-3}$ or more. Further, the epitaxial layer 50 is a silicon single-crystal layer that is obtained by performing epitaxial growth while introducing boron and carbon. By containing carbon, it is possible to restrain the diffusion of boron, and to maintain the boron concentration in the epitaxial layer 50 at a high concentration. Thereby, it is possible to maintain the resistance of the epitaxial layer 50 itself at a low resistance, and it is possible to restrain a short channel effect from being generated due to the diffusion of boron to a channel region 10c. The generation of the short channel effect causes the deterioration of the transistor characteristics.

The contact plug 70 is provided on the epitaxial layer 50. The contact plug 70 is provided so as to protrude to the source layer 21 or the drain layer 20 downward of a surface F of the semiconductor substrate 10. Details of the shape of the epitaxial layer 50 and the shape of the contact plug 70 will be described later with reference to FIG. 4.

The contact plug 70 includes a barrier metal layer 72 and a plug 73. The contact plug 70 may further include a silicide layer that is provided between the barrier metal layer 72 and the epitaxial layer 50. The silicide layer is formed by the reaction of the metal of the barrier metal layer 72 and the silicon of the epitaxial layer 50.

The barrier metal layer 72 is thinly provided on an inner wall of a contact hole CH on the epitaxial layer 50. For example, Ti or TiN is used for the barrier metal layer 72. In this case, the silicide layer is composed of TiSi (titanium silicide). When boron and carbon are diffused from the epitaxial layer 50, the silicide layer is composed of TiSi containing B and C.

The plug 73 is filled into the contact hole CH. For example, W (tungsten) is used for the plug 73.

The protection film 80 is provided on an upper surface of the GC 42, and protects the GC 42. For example, an insulation material such as a silicon nitride film is used for the protection film 80.

The interlayer insulation film 90 is provided on a side surface of the gate electrode 40 and above the protection film 80. The contact hole CH is provided in the interlayer insulation film 90, and the contact plug 70 is provided within the contact hole CH. For example, an insulation film such as a silicon oxide film is used for the interlayer insulation film 90.

The contact plug 70 is electrically connected with another element of the control circuit 101 or the memory cell array MCA. The contact plug 70 is included between the substrate 10 and the memory cell array MCA.

The liner film 92 is provided so as to coat the semiconductor substrate 10, the gate electrode 40 and the protection film 80. In the case where the transistor is a P-type MOSFET, the liner film 92 makes it possible to apply compressive stress to the channel region 10c and to increase carrier mobility (mobility of the hole). In the case where the transistor is an N-type MOSFET, the liner film 92 makes it possible to apply tensile stress to the channel region 10c and to increase carrier mobility (mobility of the electron). For example, an insulation material such as a silicon oxide film is used for the liner film 92.

The transistor is a P-type MOSFET, but may be an N-type MOSFET. However, boron as a P-type impurity is more easily diffused than phosphorus or arsenic as an N-type impurity, and therefore, adverse influences such as the short channel effect and contact resistance increase due to heat load are relatively larger in P-type MOSFETs. Accordingly, in the embodiment, descriptions will be made assuming that the transistor is a P-type MOSFET.

Figure 4:
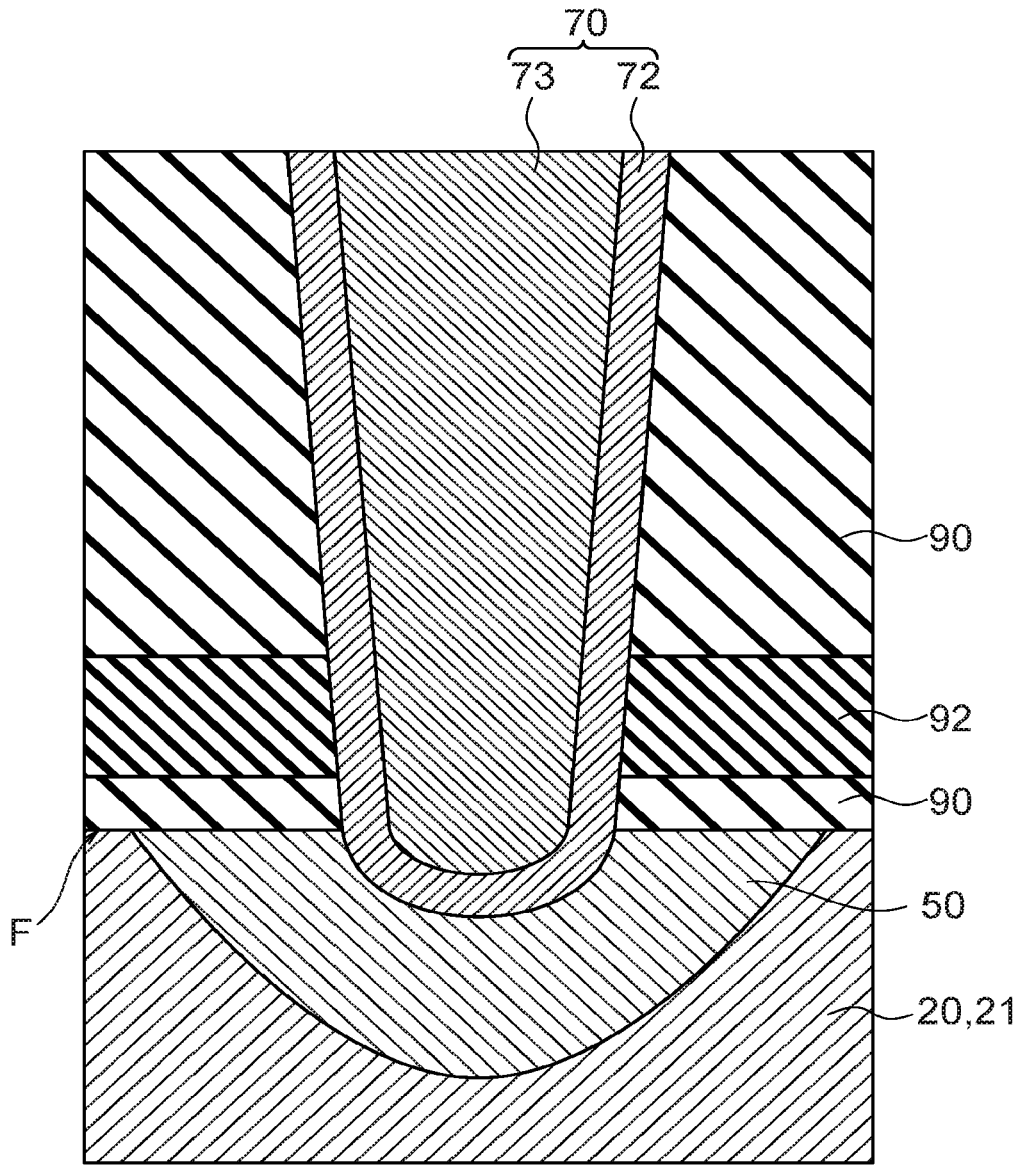
FIG. 4 is an enlarged view showing an example of the periphery of an epitaxial layer in FIG. 3.

FIG. 4 is an enlarged view showing an example of the epitaxial layer 50 in FIG. 3 and the periphery.

As described above, the contact plug 70 is provided so as to protrude downward of the surface F of the semiconductor substrate 10. The contact plug 70 is composed of metal, and therefore has a relatively low resistance. Accordingly, it is possible to reduce the contact resistance as the contact plug 70 is longer.

Further, the epitaxial layer 50 is disposed so as to cover the contact plug 70 that protrudes downward of the surface (surface F) of the semiconductor substrate 10. The epitaxial layer 50 contains boron at a high concentration, and therefore, has a lower resistance than the source layer 21 or the drain layer 20. Therefore, it is possible to electrically connect the contact plug 70 and the source layer 21 or drain layer 20, through the epitaxial layer 50 having a relatively low resistance. Further, the epitaxial layer 50 covers a bottom portion of the contact plug 70 below the surface F, and therefore, it is possible to increase the surface area of a portion for the contact with the semiconductor substrate 10. As a result, it is possible to restrain the contact resistance. Further, it is possible to cause electric current to easily flow in the contact portion more uniformly.

Further, the width of the epitaxial layer 50 is larger than the width of the contact plug 70. The width is the distance in the direction (the lateral direction in FIG. 4) perpendicular to the contact plug 70. That is, the outer edge of the epitaxial layer 50 as viewed from above the semiconductor substrate 10 is on the outside of the outer edge of the contact plug 70. This is because the semiconductor substrate 10 is etched from the bottom portion of the contact hole CH in the direction (the direction parallel to the surface F) perpendicular to the contact hole CH (see FIG. 12), as described later. Further, because of the above shape, the epitaxial layer 50 is provided so as to extend from the contact plug 70 to the side of the channel region 10c. Since the epitaxial layer 50 has a relatively low resistance, it is possible to restrain parasitic resistance of a current path (current pathway) from the contact plug 70 to the channel region 10c. As a result, it is possible to further restrain the contact resistance, and to increase ON-state current.

In FIG. 3, "$d_{CS}$" denotes the diameter of the contact plug 70. Further, "$d_{width}$" denotes the width of the epitaxial layer 50 that is a contact layer. Further, "$d_{depth}$" denotes the depth of the epitaxial layer 50 that is the contact layer. Further, "$d_{recess}$" denotes the distance of the epitaxial layer 50 that extends from the bottom portion of the contact hole CH in the direction perpendicular to the contact hole CH. Further, "$d_{CS\text{-}GC}$" denotes the distance from the contact plug 70 to the GC 42.

It is preferable that the width of the epitaxial layer 50 be larger than the width of the contact plug 70, as described above. That is, it is preferable that $d_{CS} < d_{width}$ be satisfied. Further, the width of the epitaxial layer 50 is adjusted by the position relation between the contact plug 70 and the gate. The epitaxial layer 50 containing boron at a relatively high concentration functions as a current path having a low resistance. However, when the epitaxial layer 50 is too close to the channel region 10c, the short channel effect is likely to occur due to the diffusion of the boron in the epitaxial layer 50 to the channel region 10c. Accordingly, for example, it is preferable that "$d_{recess}$" satisfy $d_{CS-GC}/2 > d_{recess}$.

FIG. 5 to FIG. 8 are schematic cross sectional views showing configuration examples of P-type MOSFETs in comparative examples. The comparison between the contact resistance in the structure shown in FIG. 3 and the contact resistances in the structures in FIG. 5 to FIG. 8 will be described below. The contact resistance itself varies depending on contact cross-sectional area. Accordingly, in the embodiment, values after normalization are shown as contact resistance values.

In the case of the contact structure in the embodiment shown in FIG. 3, the contact resistance from the contact plug 70 to the source layer 21 or drain layer 20 is about 232 ohm. Further, the ON-state current is about 115 µA/µm.

Figure 5:
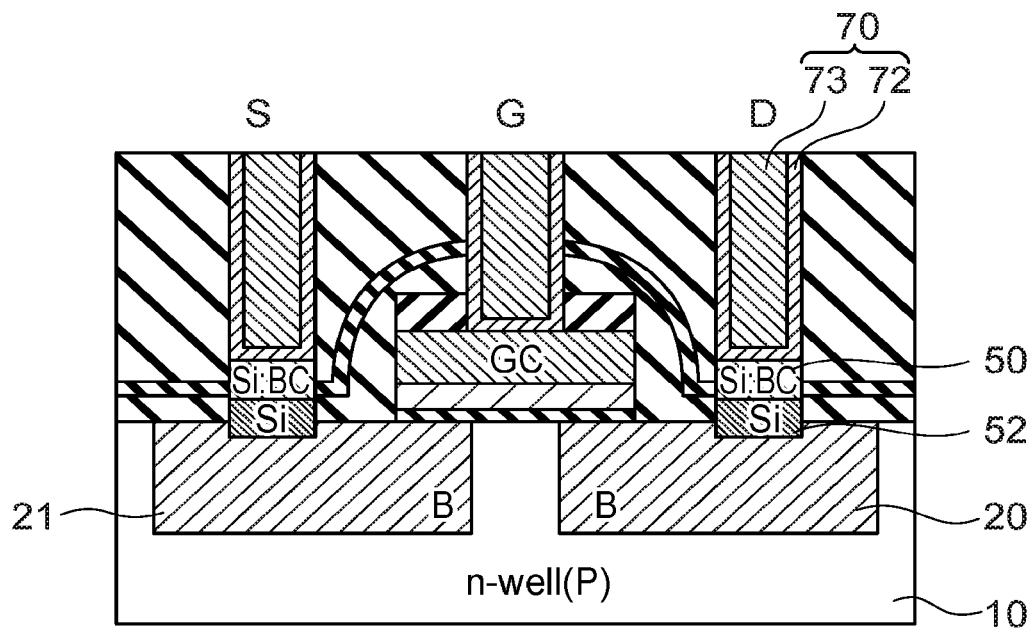
FIG. 5 is a schematic cross sectional view showing a configuration example of a P-type MOSFET in a comparative example.

In the contact structure shown in FIG. 5, an undoped epitaxial layer 52 is provided between the source layer 21 or drain layer 20 and the epitaxial layer 50. The undoped epitaxial layer 52 is an undoped epitaxial silicon layer, and is a silicon single-crystal layer that is obtained by performing the epitaxial growth without introducing the impurity. Accordingly, the undoped epitaxial layer 52 has a lower impurity concentration and a higher resistance than the epitaxial layer 50. The undoped epitaxial layer 52 is provided for enhancing the crystal state in the epitaxial layer 50 and restraining the diffusion of boron.

The undoped epitaxial layer 52 is provided to a higher position than the surface F of the semiconductor substrate 10. Further, the epitaxial layer 50 is provided on the undposed epitaxial layer 52, and the contact plug 70 is provided on the epitaxial layer 50. Accordingly, in the contact structure shown in FIG. 5, the position of the bottom portion of the contact plug 70 is a higher position than the surface F, unlike the contact structure shown in FIG. 3. Further, the width of the epitaxial layer 50 and the width of the undoped epitaxial layer 52 are almost the same as the width of the contact plug 70. Further, the undoped epitaxial layer 52 has a relatively high resistance (parasitic resistance), leading to the increase in contact resistance. The other configuration of the contact structure shown in FIG. 5 is the same as the configuration in FIG. 3. In the case of the contact structure shown in FIG. 5, the contact resistance from the contact plug 70 to the drain layer 20 or source layer 21 is about 880 ohm. Further, the ON-state current is about 95 µA/µm.

Figure 6:
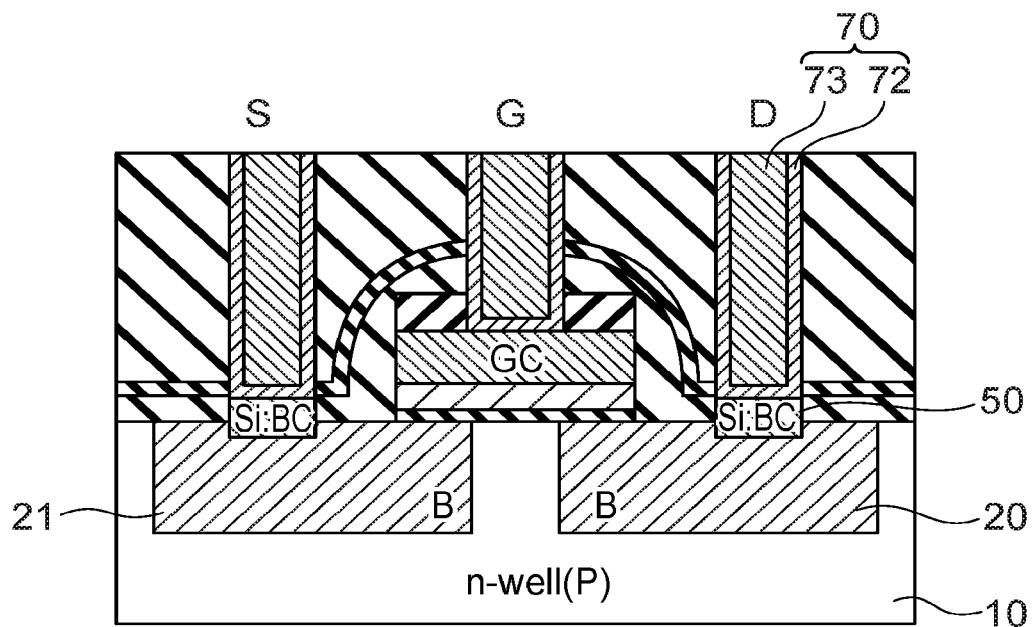
FIG. 6 is a schematic cross sectional view showing a configuration example of a P-type MOSFET in a comparative example.

In the contact structure shown in FIG. 6, the undoped epitaxial layer 52 is not provided, unlike the contact structure in FIG. 5. Since the undoped epitaxial layer 52 having a relatively high resistance is not provided, it is thought that the contact resistance can be increased compared to the structure shown in FIG. 5. The other configuration of the contact structure shown in FIG. 6 is the same as the configuration in FIG. 5. Further, in FIG. 6, the width of the epitaxial layer 50 is almost the same as the width of the contact plug 70. Accordingly, the epitaxial layer 50 shown in FIG. 6 has a smaller contact surface area and a higher contact resistance, compared to the contact structure shown in FIG. 3. In the case of the contact structure shown in FIG. 6, the contact resistance from the contact plug 70 to the drain layer 20 or source layer 21 is about 706 ohm. Further, the ON-state current is about 90 µA/µm.

Figure 7:
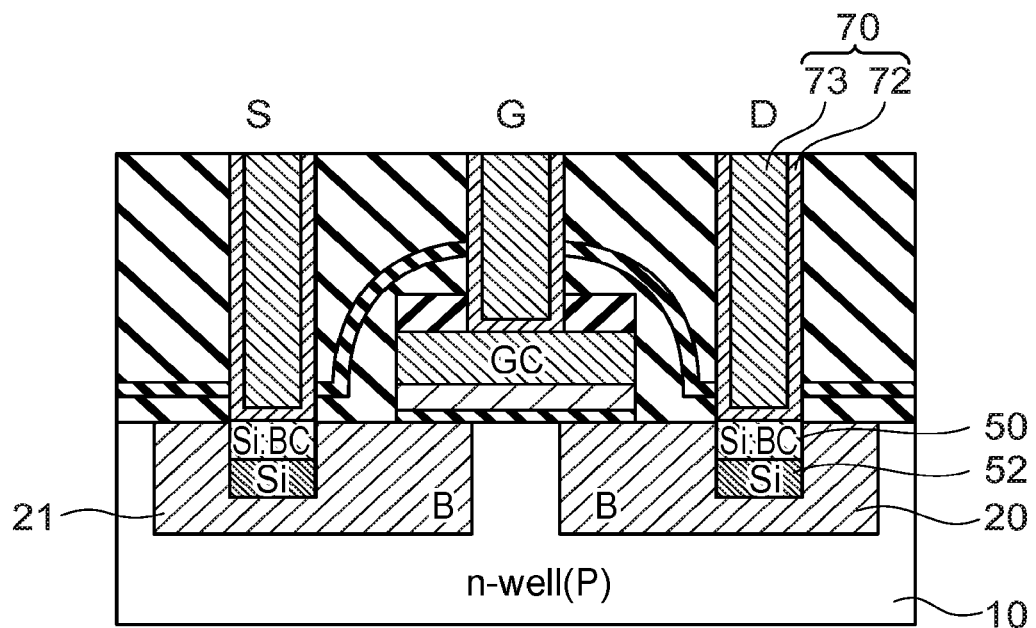
FIG. 7 is a schematic cross sectional view showing a configuration example of a P-type MOSFET in a comparative example.

In the contact structure shown in FIG. 7, the contact plug 70 is provided such that the bottom portion is at a lower position compared to the contact structure in FIG. 5. Since the contact plug 70 and the epitaxial layer 50 having relatively low resistances extend so as to be close to the source layer 21 or the drain layer 20, it is thought that the contact resistance can be restrained compared to the structure shown in FIG. 5. The other configuration of the contact structure shown in FIG. 7 is the same as the configuration in FIG. 5. Further, in FIG. 7, the width of the epitaxial layer 50 is almost the same as the width of the contact plug 70. Accordingly, the epitaxial layer 50 shown in FIG. 7 has a smaller contact surface area and a higher contact resistance, compared to the contact structure shown in FIG. 3. In the case of the contact structure shown in FIG. 7, the contact resistance from the contact plug 70 to the source layer 21 or drain layer 20 is about 800 ohm.

Figure 8:
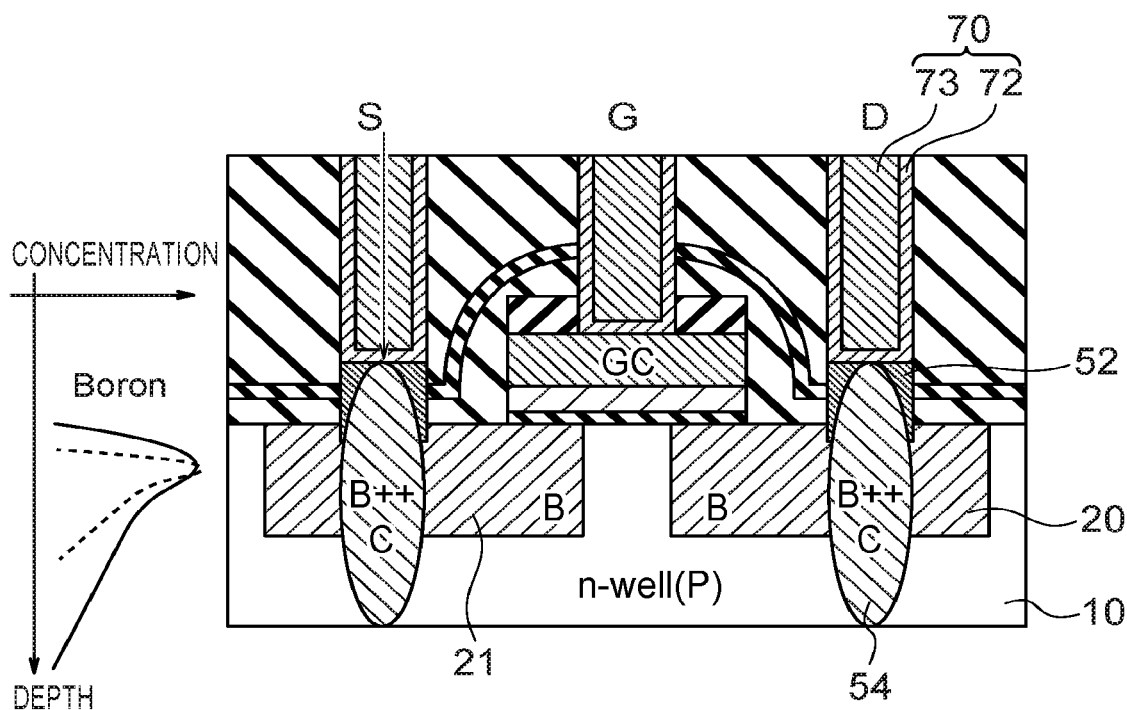
FIG. 8 is a schematic cross sectional view showing a configuration example of a P-type MOSFET in a comparative example.

The contact structure shown in FIG. 8 is different from the contact structure shown in FIG. 5, in the introduction method for boron and carbon. In FIG. 8, the formation of the epitaxial layer 50 by the epitaxial growth is not performed, and the undoped epitaxial layer 52 is formed. Thereafter, boron and carbon are introduced to the undoped epitaxial layer 52 by an ion implantation method. Accordingly, a distribution 54 of boron and carbon shown in FIG. 8 is different from those in FIG. 3 and FIG. 5 to FIG. 7. This is because the spatial control of the impurity concentration is more difficult in the ion implantation method than in the epitaxial growth. For example, when an attempt is made to dope highly concentrated boron at a desired position, the doping may reach a further deeper position and the leakage and the short channel effect may occur. Further, in the ion implantation method, the crystal state of the undoped epitaxial layer 52 may be degraded. In addition, in the ion implantation method, it is difficult to introduce boron and carbon to positions close to the side surface of the contact plug 70 as shown in FIG. 3. The other configuration of the contact structure shown in FIG. 8 is the same as the configuration in FIG. 5. In the case of the contact structure shown in FIG. 8, the contact resistance from the contact plug 70 to the source layer 21 or drain layer 20 is about 800 ohm.

In this way, in the contact structure according to the embodiment shown in FIG. 3, the contact plug 70 is provided so as to protrude downward of the surface F, and the epitaxial layer 50 is provided so as to cover the bottom portion of the contact plug 70. Further, the epitaxial layer 50 is provided so as to extend from the contact plug 70 to the channel region 10c. Thereby, in the contact structure in FIG. 3, it is possible to reduce the contact resistance to a low resistance, compared to the contact structure in FIG. 5 to FIG. 8. Further, in the contact structure in FIG. 3, it is possible to increase the ON-state current, leading to the enhancement of the switching characteristics of the transistor and the speed-up of the operation of the control circuit 100.

Next, a manufacturing method of the semiconductor device in the embodiment will be described.

FIG. 9 to FIG. 14 are cross sectional views showing an example of the manufacturing method of the semiconductor device in the first embodiment. FIG. 9 to FIG. 14 show a manufacturing method of the P-type MOSFET as the transistor.

Figure 9:
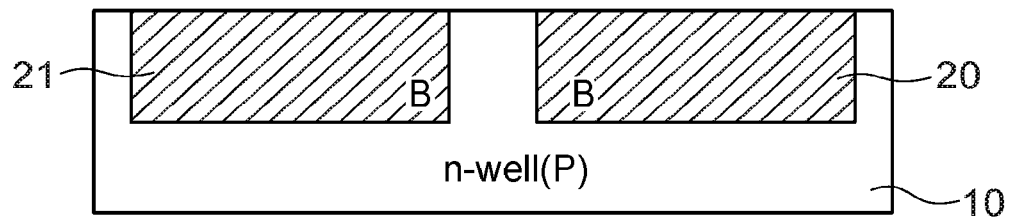
FIG. 9 is a cross sectional view showing an example of a manufacturing method of the semiconductor device in the first embodiment.

First, as shown in FIG. 9, on the semiconductor substrate 10, the impurity such as boron is introduced into the surface region of the semiconductor substrate 10, and the drain layer 20 and the source layer 21 are formed in the surface region of the semiconductor substrate 10.

Figure 10:
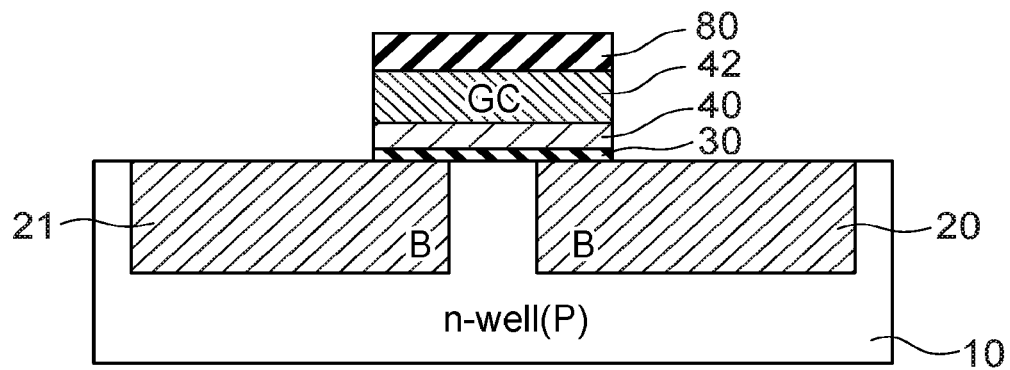
FIG. 10 is a cross sectional view showing an example of the manufacturing method of the semiconductor device, subsequently to FIG. 9.

Next, as shown in FIG. 10, the gate insulation film 30 is formed on the semiconductor substrate 10. The gate insulation film 30 may be a silicon oxide film formed by a thermal oxidation method, or may be a high-dielectric material formed by a deposition method. Next, the material of the gate electrode 40 is deposited on the gate insulation film 30. Next, the GC 42 and the protection film 80 are formed on the gate electrode 40. The plurality of laminated films after the deposition are processed using lithography, a RIE (Reactive Ion Etching) method or the like, so that a structure shown in FIG. 10 is obtained.

Figure 11:
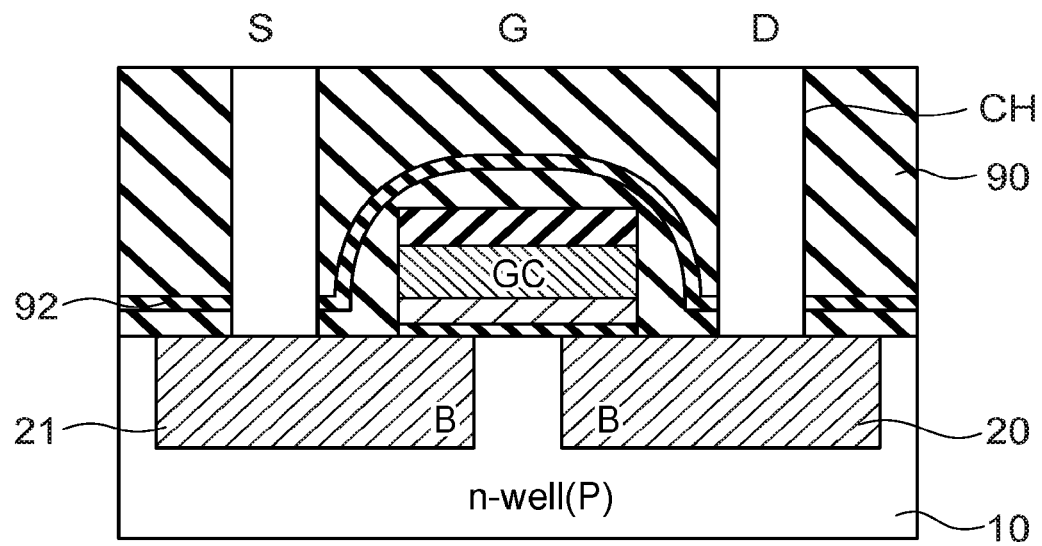
FIG. 11 is a cross sectional view showing an example of the manufacturing method of the semiconductor device, subsequently to FIG. 10.

Next, the interlayer insulation film 90 and the liner film 92 are deposited on the gate electrode 40 and the semiconductor substrate 10. For example, the interlayer insulation film 90 may be a silicon oxide film in which TEOS (Tetraethoxysilane) or the like is used. Next, as shown in FIG. 11, the contact hole CH is formed in the interlayer insulation film 90, using the lithography technology, the RIE method or the like. The contact hole CH is formed so as to pass through the interlayer insulation film 90 and to reach the drain layer 20 and the source layer 21. After the formation of the contact hole CH, a natural oxide film may be removed by performing a wet process.

Figure 12:
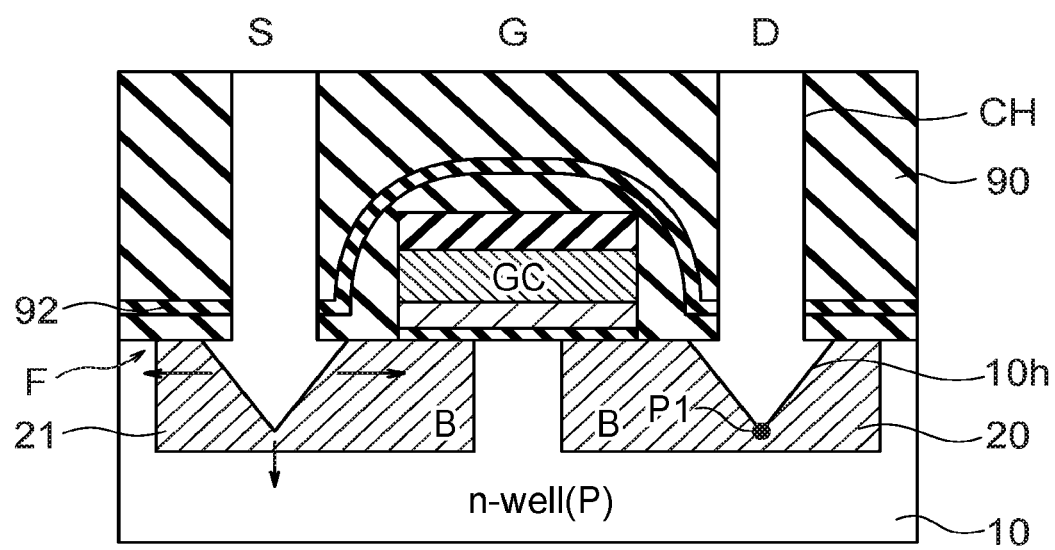
FIG. 12 is a cross sectional view showing an example of the manufacturing method of the semiconductor device, subsequently to FIG. 11.

Next, as shown in FIG. 12, a hole 10h that reaches a predetermined position P1 lower than the surface F of the semiconductor substrate 10 from the surface F of the semiconductor substrate 10 is formed in the source layer 21 or the drain layer 20. That is, the hole 10h is formed by etching the semiconductor substrate 10. More specifically, the semiconductor substrate 10 is etched by flow of an HCl gas. Thereby, as shown in FIG. 12, it is possible to etch the semiconductor substrate 10 not only in the downward direction but also in the lateral direction (the direction parallel to the surface F), and it is possible to form the hole 10h having a larger diameter than the diameter of the contact hole CH.

Figure 15:
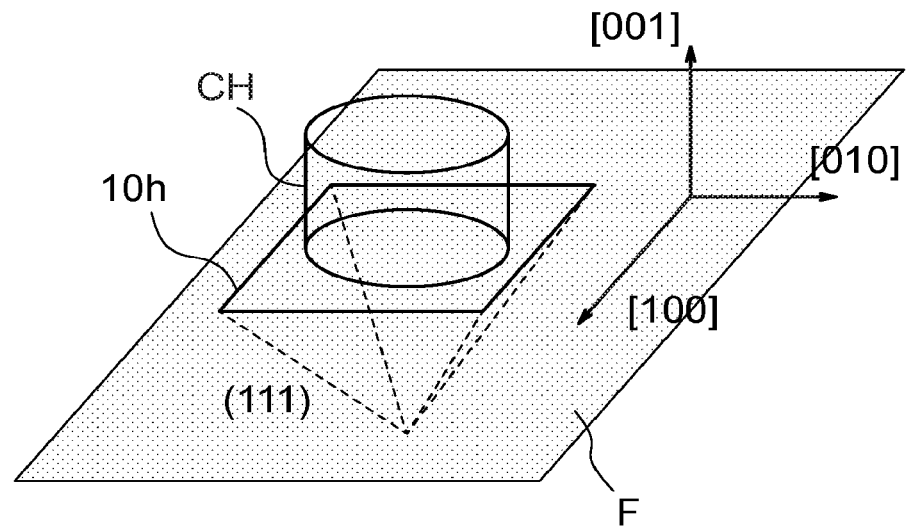
FIG. 15 is a schematic view showing an example of the shapes of a contact hole and a hole in the first embodiment.

FIG. 15 is a schematic view showing an example of the shapes of the contact hole CH and the hole 10h in the first embodiment.

The shape of the contact hole CH is a roughly cylindrical shape. On the other hand, the shape of the hole 10h is a roughly quadrangular pyramid shape. This is because a (111) plane of silicon easily appears by an anisotropic etching using the HCl gas. Accordingly, the hole 10h has a shape covered by the (111) plane. The plane covering the hole 10h may be a plane equivalent to the (111) plane, and for example, the roughly quadrangular pyramid is formed by four planes of (−1-11), (1-1-1), (−11-1) and (111). The (111) plane is a plane that is inclined by 53° with respect to a (001) plane of the substrate surface, and varies in a range of 45-60° depending on the balance between the etching rate in the depth direction and the etching rate in the lateral direction. The contact hole CH may have a rectangular parallelepiped shape or a slit shape, and the shape of the plane covering the hole 10h varies depending on the shape of the contact hole CH. For example, in the case where the contact hole CH has a slit shape, the hole 10h has a roughly triangular prism shape.

Figure 13:
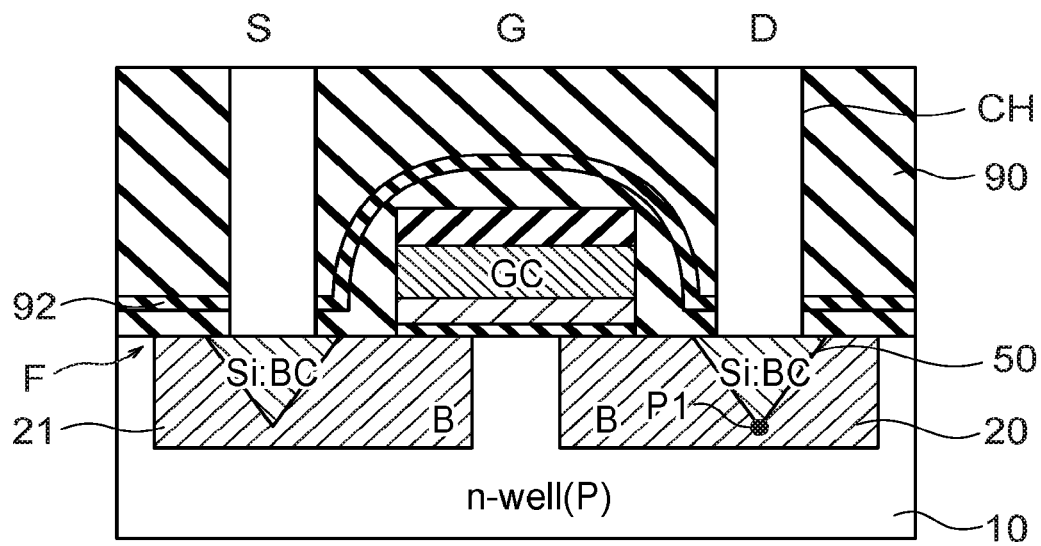
FIG. 13 is a cross sectional view showing an example of the manufacturing method of the semiconductor device, subsequently to FIG. 12.

Next, as shown in FIG. 13, the epitaxial layer 50 is formed above the source layer 21 or the drain layer 20 in the contact hole CH and the hole 10h, using the epitaxial growth method. The epitaxial layer 50 is a doped silicon crystal layer that is obtained by the epitaxial growth with the doping with both boron and carbon. For example, the boron concentration is $1 \times 10^{21}$ cm$^{-3}$ or more, and the carbon concentration is $2 \times 10^{20}$ cm$^{-3}$ or more. Thereby, the epitaxial layer 50 containing boron and carbon is formed. At this time, the epitaxial growth is performed such that an upper surface of the epitaxial layer 50 has a (001) plane, for example. Further, the epitaxial layer 50 is formed to a position close to the surface F that is a surface of the semiconductor substrate 10. In some cases, the upper surface of the epitaxial layer 50 may sink at the time of the formation of the contact plug 70, and in the example shown in FIG. 4, the upper surface of the epitaxial layer 50 is depressed in a fan-like shape. Accordingly, the epitaxial layer 50 may be formed to a position that is slightly higher than the surface F, as long as the bottom portion of the contact plug 70 is lower than the surface F.

The process in FIG. 12 and the process in FIG. 13 are continuously executed. That is, after the semiconductor substrate 10 is put in an epitaxial growth apparatus, the hole 10h having the (111) plane is formed by the HCl anisotropic etching of the semiconductor substrate 10, and instantaneously (in-situ), the epitaxial layer 50 is formed, so that the hole 10h is backfilled. By continuously executing the formation of the hole 10h having the (111) plane and the backfill with the epitaxial layer 50, it is possible to form a CMOS element having a low resistance and a large ON-state current, without leaving an impurity layer or damaged layer that causes the increase in resistance, on an interface of the hole 10h. The CMOS element having a low resistance and a large ON-state current is obtained because the semiconductor device 1 has the (111) plane of silicon on the interface between the semiconductor substrate 10 and the epitaxial layer 50.

Further, it is preferable that the epitaxial layer 50 be formed by performing the epitaxial growth of the semiconductor crystal while doping the semiconductor crystal with both the impurity and carbon. Thereby, it is possible to keep the boron in the epitaxial layer 50 at a high concentration even when heat load is applied, and it is possible to enhance heat tolerance.

Figure 14:
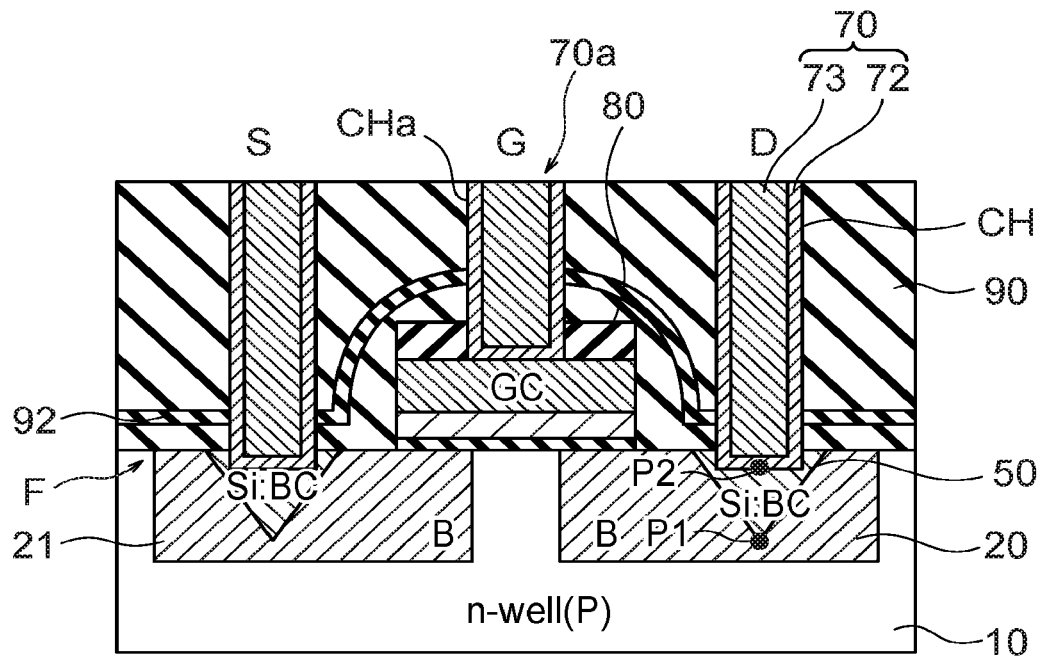
FIG. 14 is a cross sectional view showing an example of the manufacturing method of the semiconductor device, subsequently to FIG. 13.

Next, as shown in FIG. 14, a contact hole CHa reaching the GC 42 is formed. Further, the contact plug 70 on the epitaxial layer 50 and the contact plug 70a on the GC 42 are formed in parallel by forming a metal material in the contact holes CH, CHa. The contact plug 70 is formed so as to extend upward from a predetermined position P2 that is higher than the predetermined position P1 and that is lower than the surface F of the semiconductor substrate 10. For example, the barrier metal layer 72 is thinly formed in the contact hole CH, and furthermore, the plug 73 is filled into the contact hole CH. For example, Ti or TiN is used for the barrier metal layer 72. For example, tungsten is used for the plug 73. Thereby, the contact plug 70 constituted by the barrier metal layer 72 and the plug 73 is formed. Thereby, the structure of the transistor shown in FIG. 3 is obtained. Thereafter, the memory cell array MCA shown in FIG. 1 may be formed above the transistor (gate electrode 40). At this time, the silicide layer such as TiSi may be formed between the barrier metal layer 72 and the epitaxial layer 50, by the heat load in the formation process of the memory cell array MCA.

As described above, according to the first embodiment, the contact plug 70 is provided so as to protrude to the source layer 21 or drain layer 20 downward of the surface of the substrate. Further, the epitaxial layer 50 is provided between the contact plug 70 and the source layer 21 or drain layer 20. Thereby, it is possible to restrain the contact resistance.

Further, the memory cell array MCA is provided above the transistor. This is because it is possible to restrain the chip area and to increase the number (cell density) of memory cell arrays MCA per chip area, compared to a case where the memory cell array MCA is provided on a lateral side of the transistor. However, in this case, it is necessary to form the memory cell array MCA after forming the contact plug 70. Accordingly, in the heat treatment process for the formation of the memory cell array MCA, heat load is applied to the control circuit 101 and the contact plug 70. By this heat load, boron that is the impurity contained in the epitaxial layer 50, the diffusion layer and the like is easily diffused. The diffusion of boron leads to the increase in contact resistance due to the decrease in boron concentration in the epitaxial layer 50 electrically connected with the contact plug 70.

Generally, a method in which a large amount of boron is implanted and the boron concentration is increased is known as a method for restraining the contact resistance. However, when a large amount of boron is implanted, the short channel effect is likely to occur due to the diffusion of boron to the channel region 10c.

In contrast, in the first embodiment, it is possible to restrain the contact resistance without increasing the amount of boron to be implanted. Further, with the carbon contained in the epitaxial layer 50, it is possible to restrain boron from being diffused from the epitaxial layer 50 containing boron at a relatively high concentration. Accordingly, it is possible to restrain the short channel effect and contact resistance increase due to the heat load. Thereby, it is possible to reduce the contact resistance and to enhance the heat tolerance against the diffusion of boron. As a result, it is possible to enhance the characteristics of the control circuit 101, and to form a memory device having a higher capacity.

The transistor does not always need to be provided below the memory cell array MCA.

Second Embodiment

Figure 16:
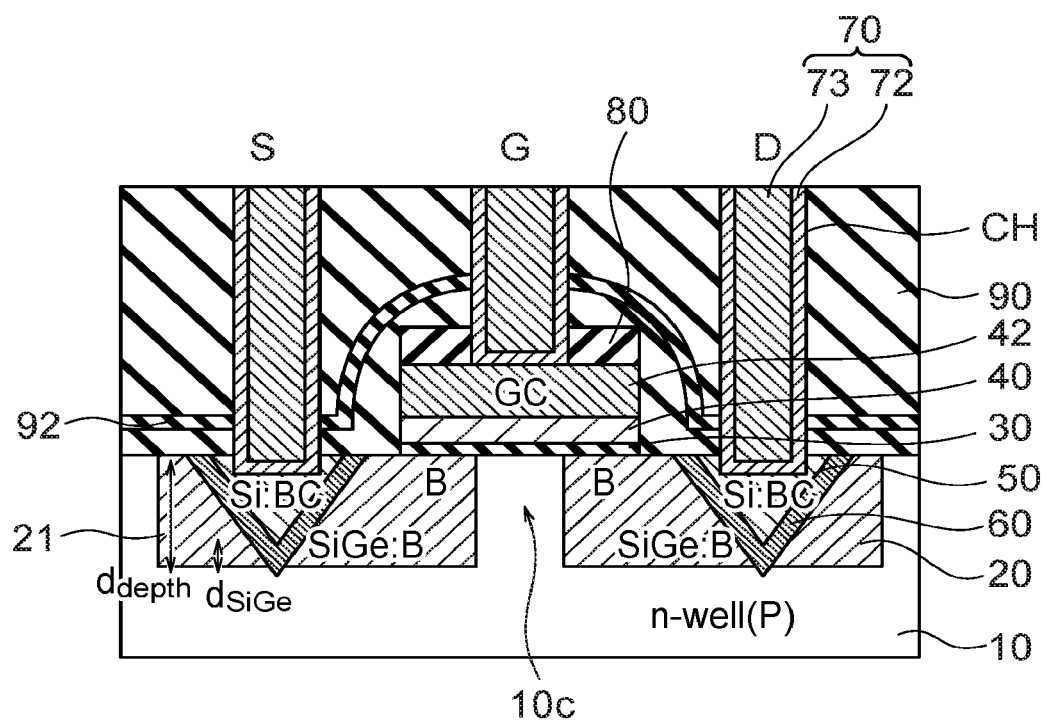
FIG. 16 is a cross sectional view showing a configuration example of a P-type MOSFET in a second embodiment.

FIG. 16 is a cross sectional view showing a configuration example of a P-type MOSFET in a second embodiment. The second embodiment is different from the first embodiment, in that an epitaxial layer 60 is provided.

The transistor further includes the epitaxial layer 60.

The epitaxial layer 60 is provided between the source layer 21 or drain layer 20 and the epitaxial layer 50, and a second material different from a first material of the epitaxial layer 50 is used. That is, the epitaxial layer 60 is provided on an outer circumference of the epitaxial layer 50. For example, the first material is Si. For example, the second material is SiGe. For example, the Ge concentration of SiGe is about 1% to about 10%. The epitaxial layer 60 further includes an impurity. For example, the impurity is boron.

The epitaxial layer 60 is disposed such that the epitaxial layer 60 on the side of the source layer 21 and the epitaxial layer 60 on the side of the drain layer 20 sandwich the channel region 10c below the gate electrode 40. SiGe in the epitaxial layer 60 has a higher lattice constant than Si. Thereby, it is possible to apply compressive stress to the channel region 10c. As a result, it is possible to increase carrier mobility (mobility of the hole) in the channel region 10c. Further, the second material (SiGe) only needs to be selected so as to give distortion to the channel region 10c.

Here, "$d_{SiGe}$" denotes the thickness of the epitaxial layer 60. That is, "$d_{SiGe}$" is the distance from a bottom portion of the epitaxial layer 50 to a bottom portion of the epitaxial layer 60.

For example, it is preferable that the thickness of the epitaxial layer 60 be equal to or smaller than half of the total thickness. That is, it is preferable that $d_{depth}/2 > d_{SiGe}$ be satisfied.

In the case where the transistor is an N-type MOSFET, for example, SiC or SiN may be used as the material of the epitaxial layer 60, instead of SiGe. SiC and SiN have lower lattice constants than Si. Thereby, it is possible to apply tensile stress to the channel region 10c of the N-type MOSFET, and to increase carrier mobility (mobility of the electron). Further, the impurity in the epitaxial layer 60 is phosphorus or arsenic, for example.

The epitaxial layer 60 is formed after the process shown in FIG. 12. That is, before the epitaxial layer 50 is formed, the epitaxial layer 60 containing the second material that is different from the first material of the epitaxial layer 50 is formed above the source layer 21 or drain layer 20 in the hole 10h, by the epitaxial growth of a semiconductor crystal.

The other configuration of the semiconductor device 1 in the second embodiment is the same as the corresponding configuration of the semiconductor device 1 in the first embodiment, and therefore, detailed descriptions therefor are omitted. The semiconductor device 1 in the second embodiment can obtain the same effect as the semiconductor device 1 in the first embodiment.

Third Embodiment

Figure 17:
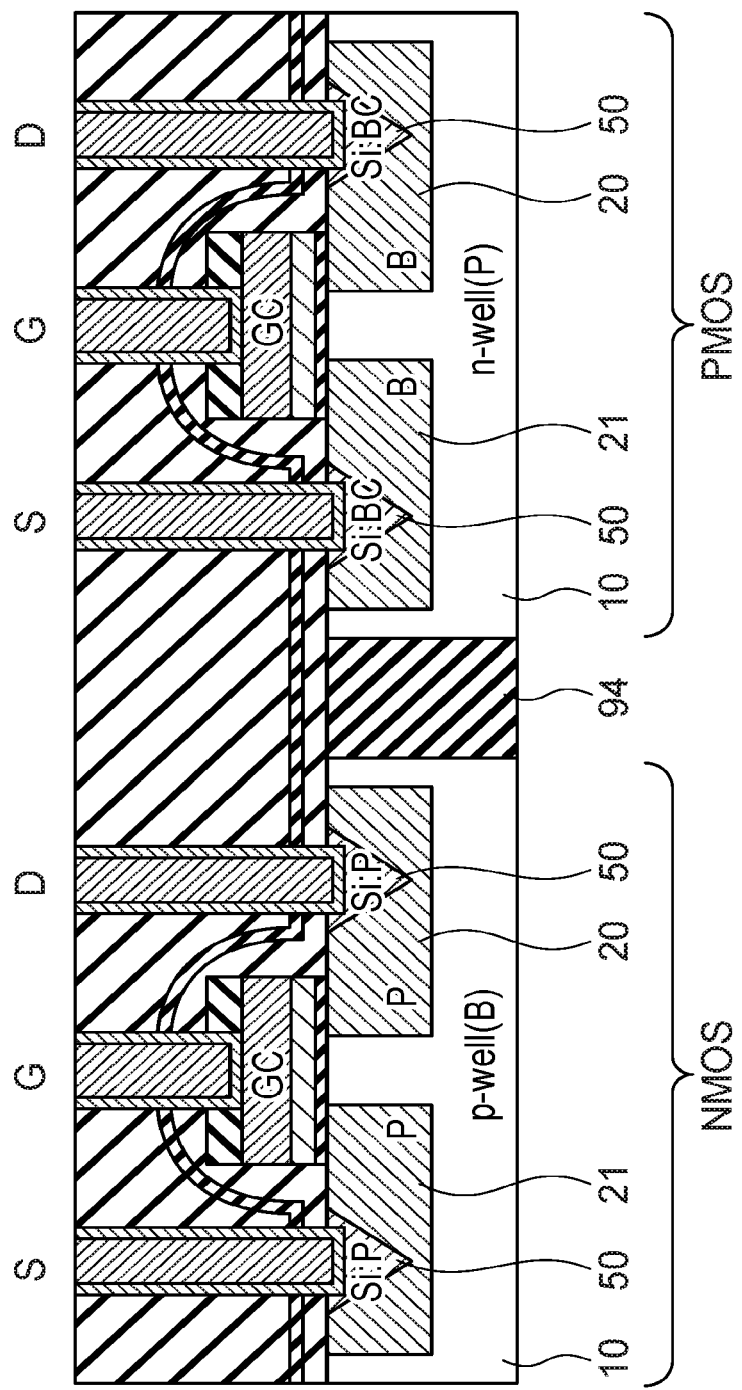
FIG. 17 is a cross sectional view showing a configuration example of an N-type MOSFET and a P-type MOSFET of a control circuit.

FIG. 17 is a cross sectional view showing a configuration example of an N-type MOSFET and a P-type MOSFET of the control circuit 101. The third embodiment is different from the first embodiment, in that the N-type MOSFET included in the epitaxial layer 50 is provided.

In the example shown in FIG. 17, the contact plug 70 and the epitaxial layer 50 are provided as described in the first embodiment, in both of the N-type MOSFET and P-type MOSFET included in the CMOS circuit. Further, for example, an insulation layer 94 is provided between the N-type MOSFET and the P-type MOSFET. The insulation layer 94 is a STI (Shallow Trench Isolation), for example, and separates the P-type well of the N-type MOSFET and the N-type well of the P-type MOSFET.

As described in the first embodiment, in the N-type MOSFET, the impurity of the epitaxial layer 50 is phosphorus or arsenic, for example. Further, similarly to the P-type MOSFET, it is preferable that the epitaxial layer 50 contain the impurity at a high concentration. Further, it is more preferable that the epitaxial layer 50 contain carbon, because it is possible to restrain the diffusion of the impurity.

In this way, in the third embodiment, it is possible to restrain the contact resistance, in both the N-type MOSFET and the P-type MOSFET.

The other configuration of the semiconductor device 1 in the third embodiment is the same as the corresponding configuration of the semiconductor device 1 in the first embodiment, and therefore, detailed descriptions therefor are omitted. The semiconductor device 1 in the third embodiment can obtain the same effect as the semiconductor device 1 in the first embodiment. Further, the semiconductor device 1 in the third embodiment may be combined with the second embodiment. That is, the epitaxial layer 60 may be provided in both the N-type MOSFET and the P-type MOSFET.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A semiconductor device comprising:
   a substrate;

a transistor including a source layer and a drain layer that are provided in surface regions of the substrate and that contain an impurity, a gate insulation film that is provided on the substrate between the source layer and the drain layer, a gate electrode that is provided on the gate insulation film, a contact plug that is provided so as to protrude to the source layer or the drain layer downward of a surface of the substrate, and a first epitaxial layer that is provided between the contact plug and the source layer or the drain layer, in contact with the contact plug and that contains both the impurity and carbon; and a memory cell array that is provided above the transistor, wherein an interface between the substrate and a bottom portion of the first epitaxial layer is a (111) plane of silicon, the transistor is a P-type MOSFET (Metal Oxide Semiconductor Field Effect Transistor), the impurity is boron, and an impurity concentration of the first epitaxial layer is more than $1\times10^{21}$ cm$^{-3}$, and a carbon concentration of the first epitaxial layer is $2\times10^{20}$ cm$^{-3}$ or more.

2. The semiconductor device according to claim 1, wherein the first epitaxial layer is disposed so as to cover the contact plug that protrudes downward of the surface of the substrate.

3. The semiconductor device according to claim 1, wherein a width of the first epitaxial layer is larger than a width of the contact plug.

4. The semiconductor device according to claim 1, wherein the transistor further includes a second epitaxial layer that is provided between the source layer or the drain layer and the first epitaxial layer and that contains a second material that is different from a first material of the first epitaxial layer.

5. The semiconductor device according to claim 4, wherein the second epitaxial layer is disposed such that the second epitaxial layer on the side of the source layer and the second epitaxial layer on the side of the drain layer sandwich a channel region below the gate electrode.

6. The semiconductor device according to claim 4, wherein
the first material is Si, and
the second material is SiGe.

7. The semiconductor device according to claim 4, wherein the second epitaxial layer further contains the impurity.

8. The semiconductor device according to claim 1, wherein,
a contact surface between a bottom surface of the contact plug and the first epitaxial layer is curved, and
the first epitaxial layer has an acute triangular shape in cross section.

* * * * *